AXIAL BIAS GATE FOR CONTROLLED RECTIFIERS

Filed July 18, 1967

INVENTOR.
HAROLD WEINSTEIN
BY
OSTROLENK, FABER, GERB & SOFFEN
ATTORNEYS 3,462,620
AXIAL BIAS GATE FOR CONTROLLED RECTIFIERS

Harold Weinstein, Van Nuys, Calif., assignor to International Rectifier Corporation, El Segundo, Calif., a corporation of California Filed July 18, 1967, Ser. No. 654,143
Int. Cl. H03k *3/26*
U.S. Cl. 307—305 3 Claims

ABSTRACT OF THE DISCLOSURE

An auxiliary gate electrode is positioned between the normal gate electrode and cathode electrode of a controlled rectifier, and is connected to a potential opposite to the firing potential of the normal gate. The auxiliary gate causes the initial injection of carriers for firing the controlled rectifier over a wider area, thereby permitting faster turn-on since the rate-of-rise-of-current can be increased during the turn-on interval. By keeping the control gate at the desired opposite potential throughout the operation cycle of the controlled rectifier, better temperature properties and higher blocking voltages are possible.

This invention relates to controlled rectifier devices, and more particularly relates to a novel auxiliary control gate for controlled rectifiers which is at a potential opposite to the firing potential of the main gate electrode, and which modifies the flow of carriers injected into the device by the main control gate.

It is well known that the rate-of-rise-of-current in a controlled rectifier must be intentionally limited by suitable circuitry since too fast a rate of turn-on can destroy or damage the device because high current conduction initially proceeds through a very thin and high resistance plasma in a region adjacent the gate electrode.

In accordance with the present invention, an auxiliary gate structure is provided which has potential opposite to that of the main gate, thereby forcing carriers initially injected from the emitter to be injected over a wider area than they would normally. Therefore, a higher area initial conduction plasma is created when the device is initially fired so that current can safely increase at a faster rate than was previously possible. Thus, faster turn-on times are produced. In addition, the novel auxiliary gate structure, when properly biased to the above-mentioned opposite polarity, can increase the forward blocking characteristics of the device, and can control the temperature characteristics of the device to make firing less sensitive to temperature change.

Accordingly, a primary object of this invention is to decrease the turn-on time of a controlled rectifier.

Yet another object of this invention is to provide a novel structure for controlled rectifiers which improves its forward blocking voltage and its temperature sensitivity characteristics.

Yet another object of this invention is to provide a novel auxiliary gate for controlled rectifiers which is held at a potential opposite the potential connected to the gate for firing the controlled rectifier with the auxiliary gate so located as to control the distribution of carriers emitted into the device from the main gate electrode.

These and other objects of this invention will become apparent from the following description when taken in connection with the drawings in which.

Figure 1:
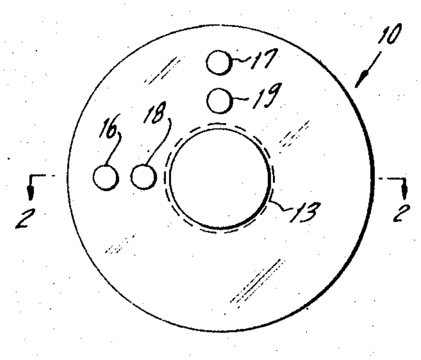
FIGURE 1 is a top view of a controlled retifier constructed in accordance with the present invention.
Figure 2:
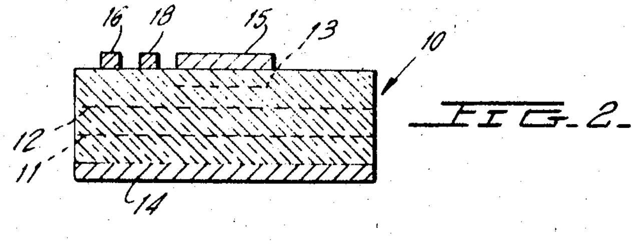
FIGURE 2 is a cross-section view of FIGURE 1 taken across the section line 2—2 in FIGURE 1.

Referring first to FIGURES 1 and 2, there is illustrated a wafer 10 of any desired semiconductive material, such as monocrystalline silicon which has formed therein three junctions 11, 12 and 13 in the usual manner. The junctions 11, 12 and 13 are formed between successive N and P conductivity regions where typically the bottom-most region can be of the P-type conductivity, while the uppermost region above junction 13 could be of the N-type conductivity. A suitable anode electrode 14, which may be of molybdenum, is then connected to the bottom surface of the wafer, while a suitable cathode electrode 15 is connected to the conductivity region above junction 13, with electrode 15 similarly being of molybdenum, or the like. It is to be noted that the dimensions of the wafer are shown in exaggerated fashion for purposes of clarity and that the wafer will be much thinner than as illustrated. Two gate electrodes 16 and 17 (FIGURE 1) are then located at about 90° with respect to one another, and are spaced from cathode 15 and connected to the conductivity-type material above junction 12 in the usual manner.

In accordance with the present invention, additional auxiliary gate electrodes 18 and 19 are located between main gates 16 and 17 and the cathode 15. Auxiliary gates 18 and 19 are then connected to a source of potential which is opposite that required to fire the controlled rectifier from gates 16 and 17. Thus, where a positive potential must be connected to gates 16 and 17 to fire the controlled rectifier, gates 18 and 19 are connected to a negative source of potential. As pointed out above, this novel auxiliary gate causes a spreading of carriers injected from the emitter adjacent gates 16 and 17, thereby increasing the initial conducting plasmas when the controlled rectifier is initially fired so that turn-on time can be decreased. In addition, the forward blocking characteristics of the rectifier and its temperature resistivity are improved, since it inhibits injection of carriers from the cathode emitter.

Figure 3:
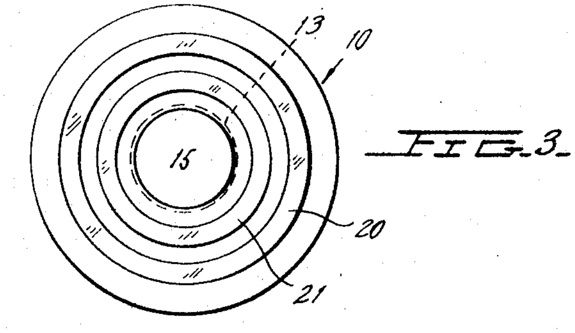
FIGURE 3 is a top view of a second embodiment of a controlled rectifier constructed in accordance with the present invention.

FIGURE 3 illustrates a second embodiment of the invention as applied to a "ring gate" type device. Thus, in FIGURE 3, the central cathode electrode 15 is normally controlled by a ring gate 20.

In accordance with the invention an auxiliary ring gate 21 is disposed between main ring gate 20 and cathode 15 to accomplish the purposes of the invention.

Figure 4:
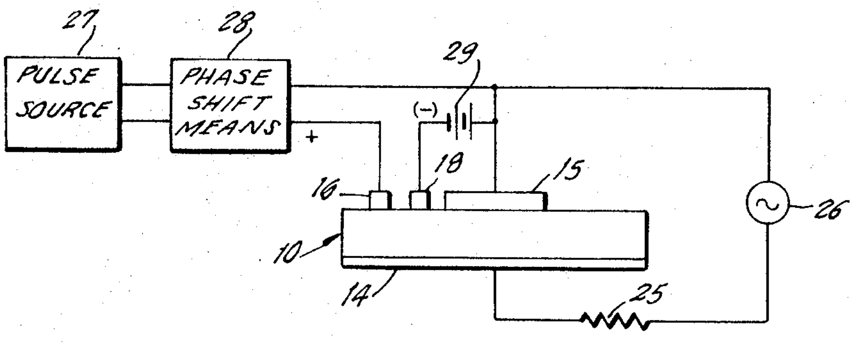
FIGURE 4 is a circuit diagram illustrating the manner in which the controlled rectifier of FIGURES 1 and 2 would be connected in a typical circuit.

FIGURE 4 illustrates a typical circuit diagram showing the controlled rectifier of FIGURE 2 connected in a circuit for supplying a variable voltage to a load 25 from A-C source 26. The controlled rectifier electrodes 14 and 15 are shown as connected in closed series relation with source 26 and load 25 in the usual manner. A suitable pulse source 27 is then connected through a phase shifting means 28 to apply a controllably phase shifted pulse betweent main gate 16 and cathode 15 in order to fire the controlled rectifier at some siutable time which is related to the phase of the A-C source 26, thereby to control the voltage applied to load 25.

In accordance with the invention and to permit a more rapid rate-of-rise-of-current through the controlled rectifier, after the firing instant, the auxiliary gate 18 is biased to a negative potential by a suitable biasing source 29 with respect to cathode 15. Thus, assuming that a positive potential pulse is connected to gate 16 in order to fire the controlled rectifier, the constant negative bias at gate 18 will cause the injection of carriers from the emitter over a wider area, thereby to accomplish the objects of the invention.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appending claims.

The embodiments of the invention in which an exclusive privilege or property is claimed are defined as follows:

1. A controlled rectifier having an auxiliary gate electrode and a control circuit therefor; said controlled rectifier comprising a wafer of semiconductor material having three parallel spaced P-N junctions extending therethrough and formed by first, second, third and fourth sequentially arranged layers of alternating conductivity-type regions; a first main electrode connected to the bottom surface and said first layer of said wafer; a second main electrode connected to the top surface and said fourth layer of said wafer; a main gate electrode connected to said third layer of said wafer with non-junction forming contact and being radially displaced from said second main electrode at said top surface of said wafer; and an auxiliary control electrode connected to said third layer with non-junction forming contact and interposed between and insulated from said second main electrode and said main gate electrode; said control circuit comprising first circuit means in series with said first and second main electrodes, second circuit means connected between said main gate electrode and said second main electrode, and third circuit means connected between said auxiliary gate electrode and said second main electrode; said third circuit means placing said auixiliary gate electrode at a potential opposite to the potential of said main gate electrode when firing potential is applied thereto by said second circuit means.

2. The device as set forth in claim 1 wherein said main gate electrode and said auxiliary gate electrode are small area electrodes compared to said second main electrode.

3. The device as set forth in claim 1 wherein said main gate electrode and said auxiliary gate electrode are concentric with one another and with said second main electrode.

References Cited

UNITED STATES PATENTS

| | | | |
|---|---|---|---|
| 3,124,703 | 3/1964 | Sylvan | 317—235 |
| 3,256,470 | 6/1966 | Gerlach | 317—235 |

JOHN W. HUCKERT, Primary Examiner

JERRY D. CRAIG, Assistant Examiner

U.S. Cl. X.R.

317—235